(12) United States Patent  
Oka et al.

(10) Patent No.: US 7,477,808 B2  
(45) Date of Patent: Jan. 13, 2009

(54) LIGHT EMITTING DEVICE AND LIGHTING DEVICE

(75) Inventors: Hirofumi Oka, Tokushima (JP); Naofumi Sumitani, Itano-gun (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 11/797,032

(22) Filed: Apr. 30, 2007

(65) Prior Publication Data

US 2007/0258684 A1 Nov. 8, 2007

(30) Foreign Application Priority Data

May 2, 2006 (JP) .............................. 2006-128144

(51) Int. Cl.  
*G02B 6/12* (2006.01)

(52) U.S. Cl. .......................................... 385/14; 385/901

(58) Field of Classification Search .................... 385/14, 385/901, 238  
See application file for complete search history.

(56) References Cited

U.S. PATENT DOCUMENTS 7,055,987 B2 * 6/2006 Staufert ....................... 362/252

2005/0073846 A1 * 4/2005 Takine .......................... 362/296

FOREIGN PATENT DOCUMENTS

| JP | 2003-23525 A | 1/2003 |
| JP | 2005-217644 A | 8/2005 |

* cited by examiner

*Primary Examiner*—Jennifer Doan  
(74) *Attorney, Agent, or Firm*—Global IP Counselors, LLP

(57) ABSTRACT

A light emitting device is provided that can effectively dissipate heat generated by high power operation and has superior workability in mounting and less positional displacement. The light emitting device includes a planar base substrate made of a metal, a package member bonded to a main surface side of the base substrate, and an insulating member and a conductive member which are provided at least partially between the base substrate and the package member, wherein the package member has opening portions where the insulating member and the conductive member are exposed at bottom parts thereof, and the opening portions include a first opening portion in which a light emitting element is mounted and a second opening portion located separate from the first opening portion and also opening from a side surface of the package member.

10 Claims, 5 Drawing Sheets

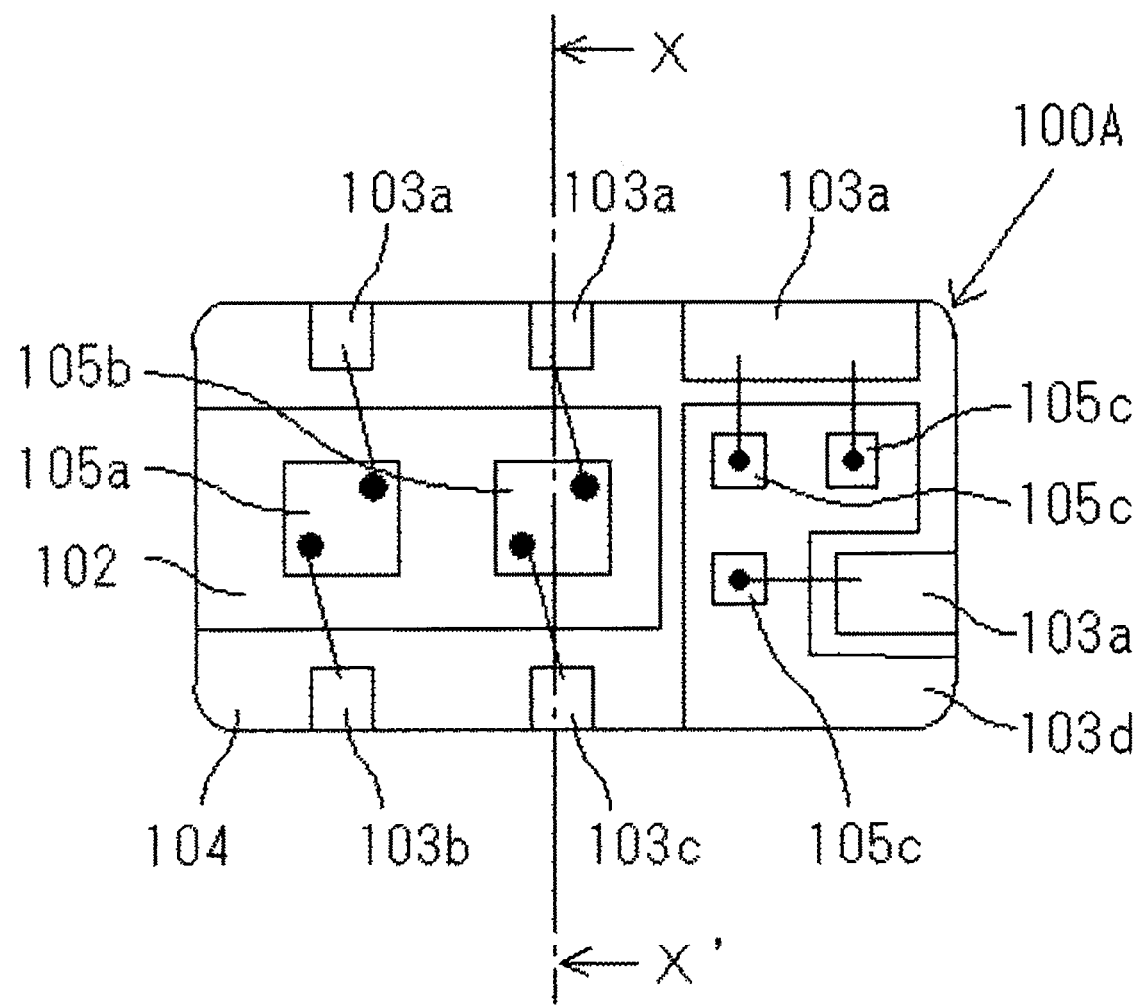

LIGHT EMITTING DEVICE AND LIGHTING DEVICE

BACKGROUND OF THE INVENTION

1. Field of the Invention

The present invention relates to a light emitting device and a lighting device using a semiconductor light emitting element.

2. Description of the Related Art

There has been a line light source and the like employing a light emitting device, which comprises a discharge tube such as a fluorescent lamp or a semiconductor light emitting element, as a lighting device of a document reader in an information processor such as a facsimile, copier, and image scanner. In recent years, downsizing of devices have been carried forward and a line light source using semiconductor light emitting elements has become mainstream. Such line light sources include a direct lighting type in which a plurality of light emitting devices are arranged in line so that light from each of the light emitting devices is projected directly onto a document etc. and a light guide type in which one or more light emitting devices are arranged at an end portion of a transparent light guide having a bar shape or a plate shape so as to introduce light thereto and then the light is projected onto a document etc. from the light guide (for example, see Japanese Laid-open Patent Application Nos. 2003-23525 and 2005-217644).

A conventional lighting device using a light guide is shown in FIG. 4. In a lighting device 500, a light emitting device 400 is arranged at an end surface of a light guide 412 so as to introduce light from the light emitting device to the end surface of the light guide 412. The light guide 412 is set to a white light guide casing 411 such that the emitting surface of the light guide 412 is exposed. Incident light to the light guide 412 is transmitted through the light guide 412 in the longitudinal direction while reflected by the inner surfaces thereof. Then, light is emitted from the emitting surface of the light guide 412 provided along the longitudinal direction so that light can be projected to a document etc. As described above, light is projected not as a point light source but as a surface light source, and thus, the lighting device 500 can emit uniform light. While the direct lighting type described above needs to mount the light emitting devices densely in order to reduce nonuniform emission, the light guide type using a light guide has an advantage in which nonuniform emission can be reduced even with fewer light sources (light emitting devices). Moreover, because the lighting device using a light guide has a simple structure in which a light emitting device is arranged only at the end surface of the light guide, it has an advantage that a complex circuit is not needed and the lighting device can be made thin.

In the light emitting device used in the lighting device described above, as shown in FIG. 3, an opening portion 300A for mounting a light emitting device is provided in a resin package 301 which is provided with a plurality of lead frames 310. The lead frames 310 protrude from a side surface of the package 301 as external connecting terminals. Then, the lead frames 310 are engaged with the circuit substrate of the lighting device and electrically connected thereto so that light can be emitted. The through holes 300D are used for fixing the light emitting device to the light guide casing when assembling a line lighting device.

In the information processors, while downsizing, various performance thereof have been improved year after year, and further improvements in performance have been required. For example, improvements in characteristics such as multifunctionality and operationality enable various processings and also allow users to make effective use, so that the range of usage has been expanding. Also, enhancement of processing capability, that is, capability of high-speed processing is one of the important characteristics. For high-speed processing, high-speed reading of images is necessary. There are several effective ways to achieve this, and among them, increasing the brightness of light illuminating the reading surface of a document is effective, and processing time can be reduced by increasing the quantity of light for reading data.

The amount of light can be increased by increasing the number of light emitting devices that are used as the light source. That is, in the above-described direct lighting type in which a plurality of light emitting devices are arranged in line, it can be achieved by densely mounting the light emitting devices. However, in this case, the size of the lighting device becomes larger so that the image reading device inevitably becomes larger. Moreover, there are negative effects in which the densely mounted light emitting devices produce a large amount of heat, the power consumption is also increased, and deterioration of various electronic components is accelerated, and therefore, it is undesirable to densely mount the light emitting devices.

In the light guide type in which the light emitting devices are mounted at an end surface of the light guide, the area of the end surface is limited. In this case, high power output can be realized by increasing the number of the light emitting elements incorporated in a light emitting device. However, this case is similar to the case described above in that a plurality of light emitting elements, which generate heat, are used. Therefore, problems caused by the generated heat from the light emitting elements occur.

To solve the problems caused by heat generation, in aforementioned Japanese Laid-open Patent Application No. 2003-23525, a material having high heat conductivity is used for the lead frame and thereby improving heat dissipation. In Japanese Laid-open Patent Application No. 2005-217644, heat dissipation is improved by providing an extended portion to the lead frame.

However, even if a material having high heat conductivity is used as described above, a portion of lead frame which is used as a pathway for heat dissipation is narrowed, so that it is difficult to dissipate heat. Therefore, sufficient heat dissipation cannot be obtained.

Also, mounting the light emitting device to the lighting device may be difficult because a plurality of lead frames protrude from the light emitting device. That is, in mounting, the lead frames are inserted in corresponding holes provided in the circuit and the like. Thus, workability may deteriorate when the number of the lead frames increases. In another case, the light emitting device inclines and that may cause deviation of the distance and degree between the light emitting device and the end surface of the light guide from desirable values. If this occurs, output from the light guide decreases. In addition, a part of the exposed lead frame may be bent during the manufacturing process etc., which makes inserting the lead frame into the corresponding hole more difficult.

Accordingly, the present invention is devised to provide a light emitting device capable of effectively dissipating heat generated by high power operation and has superior workability in mounting and less positional displacement.

SUMMARY OF THE INVENTION

To achieve the object described above, a light emitting device according to the present invention comprises a planar base substrate made of a metal, a package member bonded to a main surface side of the substrate, and an insulating member and a conductive member which are provided at least partially between the base substrate and the package member, wherein the package member has opening portions where the insulating member and the conductive member are exposed at bottom parts thereof, and the opening portions include a first opening portion in which a light emitting element is mounted and a second opening portion located separate from the first opening portion and also opens to a side surface of the package member. With this configuration, heat generated from a semiconductor element can be dissipated quickly to outside through the metallic base substrate, so that degradation due to heat can be prevented. Because the conductive member does not protrude to outside, mounting can be carried out without bending or damaging the conductive member and workability can be improved. Also, because a smaller region of the conductive member is exposed to outside, deterioration thereof can be controlled.

Moreover, a part of the base substrate preferably penetrates the insulating member and is exposed at the bottom part of one of the first and second opening portions. With this construction, heat from the light emitting element can be more efficiently dissipated to outside.

The package member preferably has a third opening portion in which the protective element is mounted. With this construction, a light emitting device having excellent electrostatic breakdown strength can be obtained.

Also, a lighting device of the present invention comprises a light emitting device, a light guide introducing emission from the first opening portion from an end surface and an external electrode connected with a conductive member exposed at a bottom part of the second opening portion. With this construction, a lead frame can be electrically bonded without protruding from the light emitting device. Also, because the package member is not provided on the rear surface of the light emitting device, the thickness of the light emitting device when it is laced at an end surface of the light guide member can be further reduced, so that downsizing of the lighting device can be achieved.

In the light emitting device and lighting device according to the present invention, heat can be transferred effectively from the light emitting element to outside, therefore, a light emitting device and lighting device with excellent lifetime performance can be obtained without lowering the light emitting efficiency.

BRIEF DESCRIPTION OF THE DRAWINGS

FIG. 1C is a partially enlarged view of the light emitting device illustrated in FIG. 1A.

DETAILED DESCRIPTION OF THE PREFERRED EMBODIMENTS

Figure 1A:
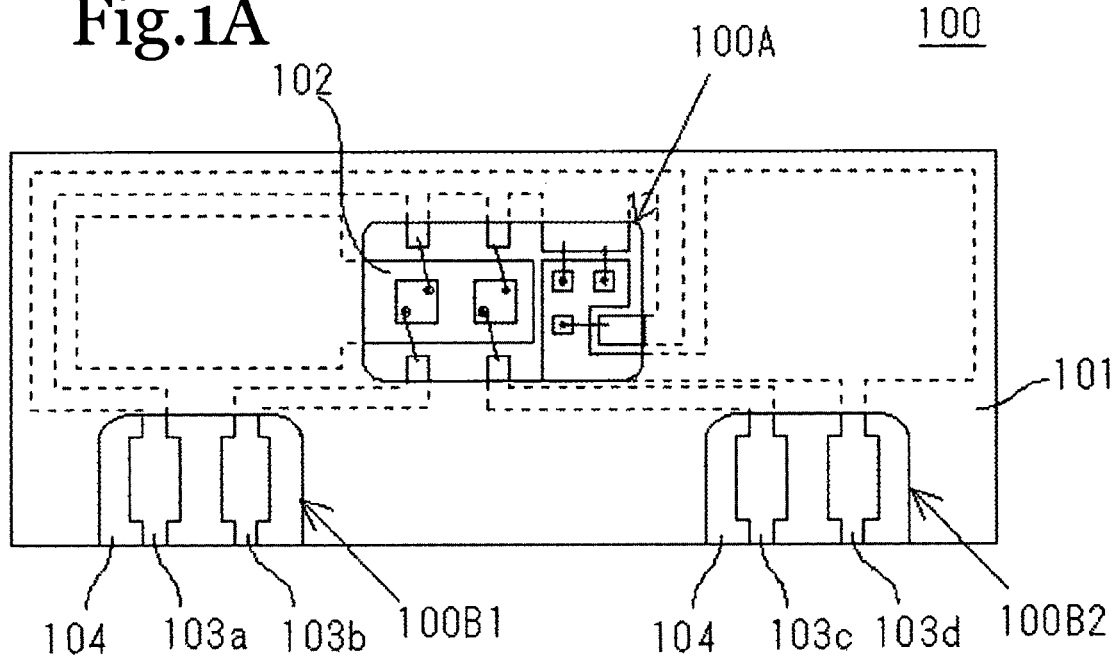
FIG. 1A is a front elevational view of a light emitting device according to one embodiment of the present invention.

The preferred embodiments of the present invention will be described below with reference to the accompanying drawings. Herein, the forms of the following embodiments are intended as examples of a light emitting device and a lighting device according to the present invention. Thus, the following descriptions of the embodiments according to the present invention are provided for illustration only, and not for the purpose of limiting the invention as defined by the appended claims and their equivalents.

In addition, the present specification will by no means limit the members described in claims to the members described in the embodiments. Unless otherwise specified, the dimensions, materials, shapes, relative layouts and so fourth of the constituent members described in the preferred embodiments are for illustration only, and do not intend to limit the invention therein. The sizes, positional relationships, and so forth of the members shown in the drawings may be exaggerated in order to clarify the description. Furthermore, in the description below, identical members or members of the same quality are assigned the same names and reference numerals and detailed description thereof will be arbitrarily omitted. In addition, the elements that make up the present invention may be such that a plurality of elements are constituted by a single member so that a single member can serve as multiple elements, or conversely, function of a single element may be shared by a plurality of members. The light emitting device and the lighting device according to the present embodiment will be described below with reference to the accompanying drawings.

FIG. 1 shows a light emitting device 100 of the present embodiment. FIG. 1A is an elevational view from the front and FIG. 1B is a perspective view. FIG. 1C is an enlarged view of a first opening portion 100A and FIG. 1D is a cross-sectional view taken along a section line X-X' of FIG. 1C. FIG. 1E is an enlarged view of a second opening portion 100B.

Figure 1B:
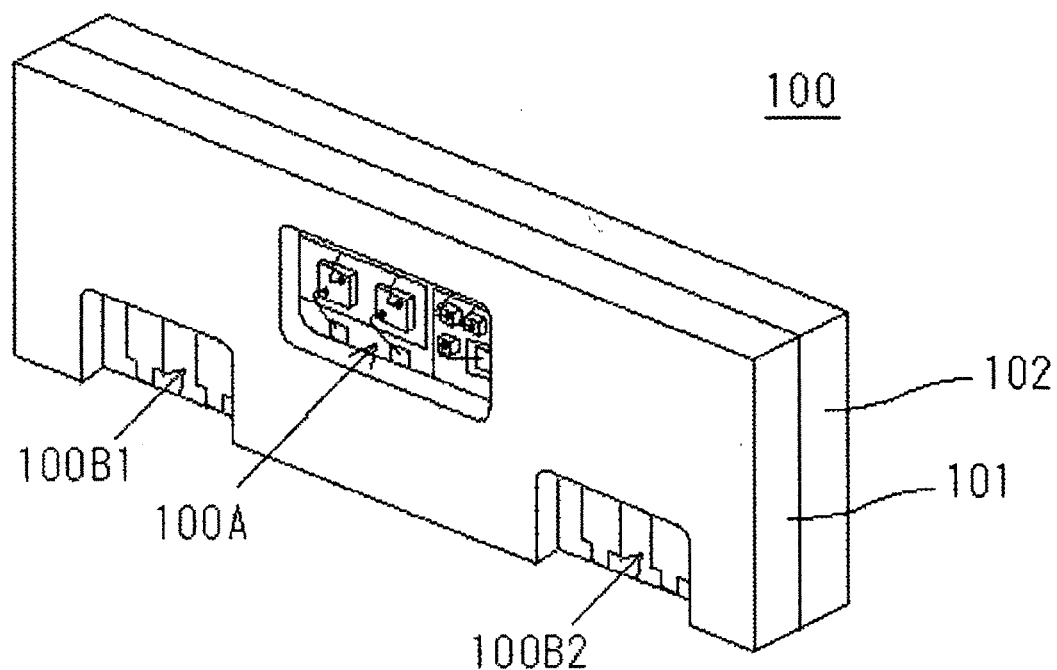
FIG. 1B is a schematic perspective view of the light emitting device illustrated in FIG. 1A.

In FIGS. 1A and 1B, a package member 101 is bonded to one surface of a planar base substrate 102 made of metal. An insulating member 104 and a plurality of conductive members 103a, 103b, 103c, and 103d are provided between the base substrate 102 and the package member 101. Further, the first opening portion 100A and the second opening portions 100B1 and 100B2, in which the insulating member and the conductive members are exposed at the bottom surfaces thereof, are formed. In other words, the first opening portion 100A and the second opening portions 100B1 and 100B2 are formed in the package member 101 so that the base substrate 102 and/or the conductive members 103a to 103d are not covered by the package member 101 at the first opening portion 100A and the second opening portions 100B1 and 100B2. The second opening portions 100B1 and 100B2 also open to a side surface of the package member 101. The conductive materials 103a to 103d extend continuously from the first opening portion 100A to the second opening portions 100B1 and 100B2, and connected to external electrodes at the second opening portions 100B1 and 100B2 so that current can be supplied to light emitting elements 105a to 105c.

Each constituent of the light emitting device 100 of the present invention will now be described below.

(Base Substrate)

In the present invention, the base substrate 102 is made of metal, and especially, a metal having good thermal conductivity is preferably used. Specific examples of such materials include, but not limited to, copper (thermal conductivity of 390 W/m·K), iron (thermal conductivity of 84 W/m·K), aluminum (thermal conductivity of 236 W/m·K), and the like, and copper and aluminum are preferable. Such metals can be used not only singly but also as an alloy. Such metals may be multi-layered. The thickness of the base substrate 102 can be arbitrarily set according to the size and so forth of the light emitting device 100.

The shape of the base substrate 102 is preferably generally planar, and a metal plate having a desired thickness and so forth can be used as the base substrate 102. A generally planar structure can be easily processed, so that the package member 101 can be easily bonded to the base substrate 102 in a manufacturing process. However, it is acceptable to apply a process such as forming fine irregularity on the surface of the base substrate 102. In other words, smoothness of the surface is not specifically limited to be perfectly flat as long as the surface of the base substrate 102 is generally planar. Heat is released to outside from the surface (rear surface) of the base substrate 102 to which the package member 101 or the like is not bonded. Therefore, by applying a processing such as forming irregularity to the surface of the base substrate 102 to increase the surface area, the light emitting device 100 with further excellent heat dissipation can be obtained.

The shape viewed from the front surface side of the base substrate 102 (the side on which the package member 101 is provided) is preferably substantially rectangular, and the specific shape of the base substrate 102 can be arbitrarily selected according to purpose and usage of the light emitting device 100. For example, the shape may be a horizontally long rectangle as shown in FIG. 1A, or a vertically long rectangle as shown in FIG. 2. FIG. 2 shows a modified light emitting device 200 in accordance with the present invention.

Figure 1D:
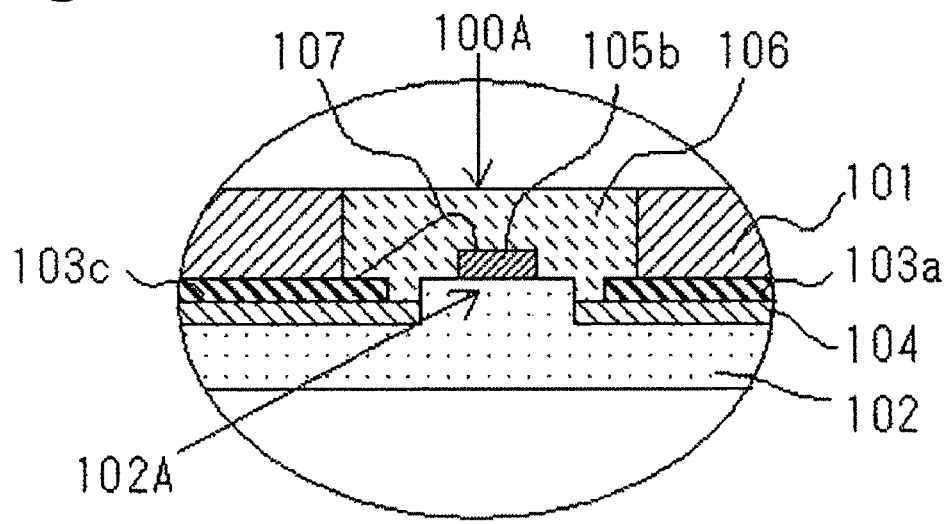
FIG. 1D is a partial cross sectional view of the light emitting device taken along a section line X-X' of FIG. 1C.

As described above, the base substrate 102 is preferably generally planar, but a protruding portion or portions may be provided on the base substrate 102. For example, as shown in FIG. 1D, at the bottom surface of the first opening portion 100A (i.e., the portion of the base substrate 102 corresponding to the first opening portion 100A of the package member 101), a part of the base substrate 102 may have a protruding portion 102A which penetrates through the insulating member 104 and is exposed at the bottom surface of the first opening portion 100A. When the light emitting element 105b is mounted on the upper surface of the protruding portion 102A, heat generated from the light emitting element 105b is directly transferred to the base substrate 102, so that efficient heat dissipation can be obtained. Especially, when a gallium nitride based semiconductor is used as the light emitting element 105b, the amount of generated heat is greater than the amount of generated heat when a gallium arsenide based semiconductor etc. is used. Therefore, by bonding the light emitting element 105b directly to the base substrate 102, heat dissipation can be improved and deterioration of the light emitting element 105b can be prevented.

Figure 4:
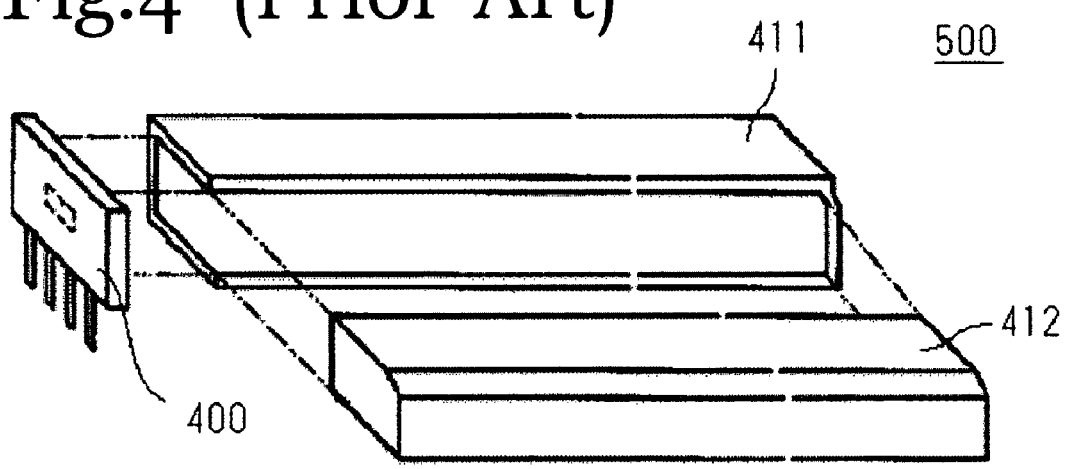
FIG. 4 is a perspective view illustrating a lighting device using a conventional light emitting device.

Furthermore, a through hole can be formed in the light emitting device. The light emitting device of the present invention may be mounted in a lighting device (e.g., a lighting device including the light guide 412 and the light guide case 411 as shown in FIG. 4) and, with a light guide and other components of the lighting device, incorporated into an information processor such as a printer and the like. In such case, the through hole formed in the light emitting device can be used for position adjustment or the like. For example, as the through holes 200D shown in FIG. 2 and the like, the through hole openings that penetrate through the base substrate and the package member may be provided in regions that would not affect the operations and characteristics of the light emitting device either optically or electrically. Then, the base substrate can be fitted with a light guide and other components of the lighting device, so that positioning and fixing can be carried out easier.

(Package Member)

In the present invention, the package member 101 of the light emitting device 100 has at least the first opening portion 100A formed in a position corresponding to a portion of the base substrate 102 in which the light emitting elements 15b are mounted. The package member 101 further includes the second opening portions 100B1 and 100B2 which are spaced from the first opening portion 100A and also open to a side surface of the package member 101. The conductive members 103a to 103d which extend from the first opening portion 100A are exposed at the bottom surface of the second opening portions 100B1 and 100B2 in order to establish an electric connection with the external electrodes (not shown). The insulating member 104 and the conductive members 103a to 103d are interposed at least a part between the package member 101 and the substrate 102. The substrate 102 and the package member 101 may be bonded by a bonding member such as an epoxy resin, a conductive adhesive material, an adhesive sheet, and the like.

Figure 2A:
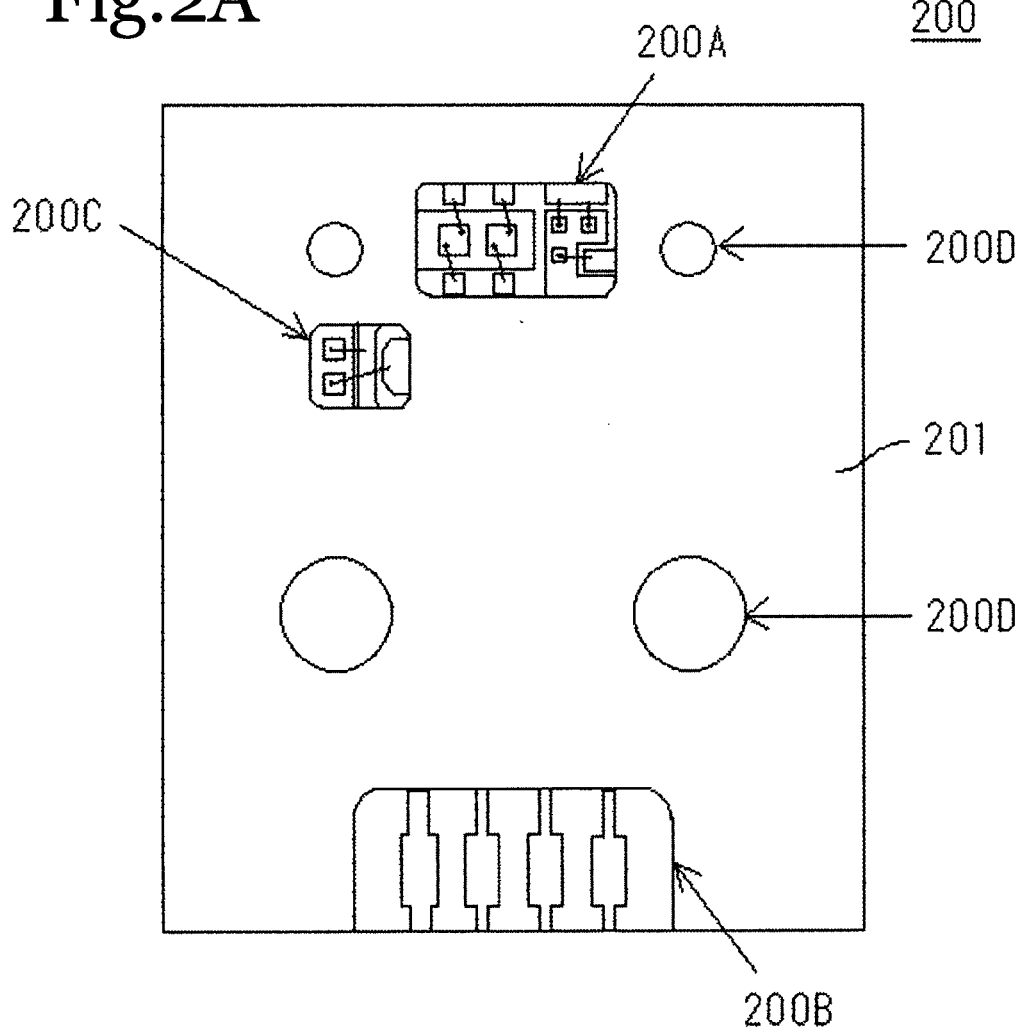
FIG. 2A is a front elevational view of a modified light emitting device according to the embodiment of the present invention.

The package member 101 preferably has a shape generally planar, in a similar way as the base substrate 102. When viewed from the front, the outermost shape of the package member 101 is preferably substantially the same as that of the base substrate 102. For example, as shown in FIG. 1A and FIG. 2A, a rectangular shape of the package member 101 is preferable in conformity with the rectangular base substrate 102. In this case, the substrate 102 and the package 101 can be made substantially the same size by, for example in a post-process, after bonding the package member 101 on the substrate 102, carrying out cutting at desired positions to obtain the individual light emitting device. However, it is not limited thereto and the size of the substrate 102 and the package member 101 may be different. Furthermore, it is necessary to arrange the substrate 102 so as to be able to form the bottom surfaces where the conductive members 103a to 103d are exposed, in the regions for the first opening portion 100A and the second opening portions 100B1 and 100B2.

As the material for the package member 101, an insulating member or a member which does not transmit light from the light emitting elements 105a to 105c and external light easily are preferable. In addition, a material having a certain degree of strength is preferable to be used as the material for the package member 101. Specific examples of the materials include, but not limited to, phenol resins, glass epoxy resins, BT resins, ceramics (aluminum nitride and alumina), and PPA. The package member 101 may be obtained by forming such materials in generally planar shape and bonding to the base substrate 102 with an above-mentioned adhesive member and the like.

(First Opening Portion)

In the first opening portion 100A, the conductive members 103a to 103d are exposed at the bottom surface so as to electrically connect the conductive members 103a to 103d with the light emitting elements 105a to 105c. The location for forming the first opening portion 100A is arranged in FIG. 1A at a generally center portion in the longitudinal direction; and in the shorter direction, at a position with a longer distance from the side surface where the second opening portions 100B1 and 100B2 are formed (i.e., a position closer to the side surface where the second opening portions 100B1 and 100B2 are not formed than the side surface where the second opening portions 100B1 and 100B2 are formed). However, the arrangement of the first opening portion 100A is not limited thereto and suitably designed according to the shape or the like of the lighting device in which the light emitting device 100 is incorporated, and other components. For example, the first opening portion 100A may be arranged at a position offset from the center in the longitudinal direction.

As the shape of the opening of the first opening portion 100A, a rectangle with rounded corners is shown in FIG. 1A as an example, but the shape is not limited thereto. For example, the shape of the opening may be square, circular, oval, diamond, or trapezoidal. Also, the number of the first opening portion 100A is not limited to one as shown in FIG. 1A, but a plurality of the first opening portions 100A may be provided in the package member 101. In addition, a shape which is a combination of various shapes can be employed. For example, a shape formed by connecting two openings of circular opening portions can be employed. Also, in the case where the shape of the first opening portions 100A is generally rectangular as shown in FIG. 1A, a side surface of the package member 101 and the side surface of first the opening portion 100A may be arranged substantially in parallel (as shown in FIG. 1A) or at an angle.

The side surface of the first opening portion 100A is illustrated as being substantially perpendicular to the bottom surface in FIG. 1D. However, the shape or angle of the side surface of the first opening portion 100A is not limited thereto, and the side surface may be inclined. In this instance, light irradiated to the side surface can be reflected in the opening direction by inclining the side surface toward the opening direction of the first opening portion 100A, so that light extraction efficiency can be improved.

The light emitting elements 105a to 105c provided in the first opening portion 100A may be mounted on one or more of the conductive members 103a to 103d, the insulating member 104, or the protruding portions 102A of the base substrate 102 as described above, or may be mounted via another member such as a submount. As the light emitting elements 105a to 105c, semiconductor light emitting elements capable of respectively emitting light of blue, green, and red, are used. The size and number etc. of the light emitting elements 105a to 105c can be arbitrarily selected. For example, as shown in FIG. 1, a blue light emitting element, a green light emitting element and three red light emitting elements may be mounted. Therefore, the first opening portion 100A is needed to have an area for mounting the light emitting elements 105a to 105c and a size that is capable of exposing the conductive members 103a to 103d for establishing an electrical connection and also is capable of wire bonding.

The light emitting elements 105a to 105c or the like is arranged in the first opening portion 100A, therefore, the first opening portion 100A is preferably filled with a sealing member to cover them. For example, as shown in FIG. 1D, an insulating member 106, which covers the light emitting elements 105a to 105c (only the light emitting element 105b is shown in FIG. 1D) and the conductive wires 107, is filled in the first opening portion 100A. The insulating member 106 is adjusted to approximately the same height as the upper surface of the package member 101 defining the first opening portion 100A. As the sealing member, a light transmitting resin capable of transmitting light from the light emitting elements 105a to 105c is preferable, specifically, a rein having excellent weather resistance, such as an epoxy resin, a silicone resin, an urea resin, and a polyamide, is preferable. Especially, a silicone resin is preferable because it also has excellent thermal resistance. The sealing member may include a diffusion member capable of diffusing light from the light emitting elements 105a to 105c, and a color converting member such as a fluorescent material which absorbs light from the light emitting element and convert to light having a different wavelength than that of the light from the light emitting elements 105a to 105c.

(Second Opening Portion)

The second opening portions 100B1 and 100B2 open, in the same manner as in the first opening portion 100A, to the upper surface of the package member 101, and further, to the side surface of the light emitting device 100 (side surface of the package member 101). In the bottom surface or the bottom portion in the second opening portions 100B1 and 100B2, the conductive members 103a to 103d continuous from the first opening portion 100A is exposed for establishing an electrical connection with the external electrodes (not shown). The second opening portions 100B1 and 100B2 are arranged to expose the conductive members 103a to 103d at the side surface of the package member 101, which allows the structure to be easily mounted when the light emitting device is incorporated in the lighting device. Also, the lead frame does not protrude from the side surface etc. of the package member 101, so that damage does not occur easily.

Further, most part of the conductive members 103a to 103d is enclosed between the package member 101 and the base substrate 102, so that only the portions of the conductive members 103a to 103d at the bottom portions of the second opening portions 100B1 and 100B2 are exposed. Therefore, the conductive members 103a to 103d can be prevented from accidentally touching the other members or the like and receiving electric stress, and also from being deteriorated due to oxidation, discoloring, or the like.

The shape of the second opening portions 100B1 and 100B2 is preferably a shape in which, as shown in FIG. 1, a generally rectangular bottom surface is exposed, but it is not limited thereto. In a similar manner as the first opening portion 100A, the shape of the second opening portions 100B1 and 100B2 may be square, circle, oval, diamond, trapezoid, and the like, which is arbitrarily selected according to the shape of the external electrodes or the like.

In addition, one or more of the second opening portions may be formed. For example, in FIG. 1, two second opening portions 100B1 and 100B2 are provided, in which the conductive members 103a and 103b are arranged so as to be exposed in the second opening portion 100B1 and the conductive members 103c and 103d are arranged so as to be exposed in the second opening portion 100B2. As described above, by providing a plurality of second opening portions, positioning of the light emitting device 100 with other members can be facilitated. The anodes and cathodes may be respectively exposed at the different second openings, or a second opening portion may be provided for each conductive member.

Figure 1E:
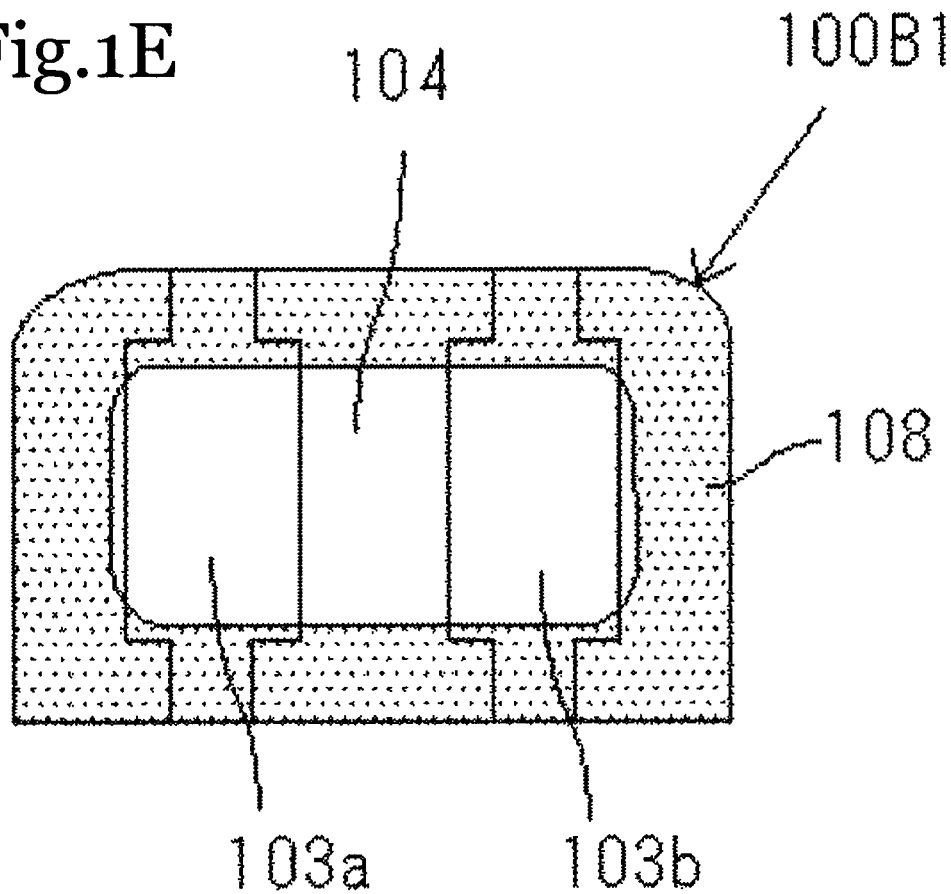
FIG. 1E is a partially enlarged view of FIG. 2A.

The conductive members 103a to 103d exposed at the bottom surface of the second opening portions 100B1 and 100B2 may be covered with a protective member except for an area which is connected to the external electrodes. For example, as shown in FIG. 1E, a protective member 108 can be arranged along a side wall of the second opening portion 100B1 so that the center portion of the conductive members 103a and 103b are exposed without being covered with the protective member 108. With this configuration, the area of the conductive members 103a and 103b exposed to ambient air can be limited to an area necessary for electrical connection, so that degradation and the like can be prevented. As the protective member, an insulating member is preferable, and specifically, a thermosetting resin such as an epoxy resin is preferable.

(Insulating Member)

The insulating member 104 is interposed to insulate the conductive members 103a to 103d arranged on the insulating member 104 and the metal base substrate 102. Therefore, the insulating member 104 is not necessarily provided on the area where the conductive members 103a to 103d are not arranged. As the material of the insulating member 104, thermosetting resins such as epoxy resins are preferable and provided on the base substrate 102 by way of printing, attaching, coating or the like. These materials may be used singly or in combination of two or more kinds. When two or more kinds of materials are used to form the insulating member 104, they may be stacked or mixed.

A thickness sufficient to maintain the insulation is needed for the insulating member 104 and a thickness of at least 5 μm is preferable, and a thickness between 15 μm to 30 μm is more preferable. Also, in view of thermal expansion coefficient etc. of the package member 101 and the base substrate 102, a filler may be mixed into the insulating member 104.

(Conductive Member)

The conductive members 103a to 103d are provided electrically continuously from the first opening portion 100A to one of the second opening portion 100B1 or 100B2, for electrically connecting with the light emitting elements 105a to 105c, a protective element, and the like. As the material of the conductive members 103a to 103d, copper, tungsten, molybdenum and the like, having excellent conductivity are preferable, and specifically, copper is preferable. The conductive members 103a to 103d need to have a sufficient thickness which does not cause an excessive electric resistance. The thickness of the conductive members 103a to 103d is preferably about 10 to 50 μm, more preferably about 15 to 40 μm. The conductive members 103a to 103d are disposed so that an area necessary for establishing an electric connection is at least exposed in the first opening portions 100A. The light emitting elements 105a to 105c are preferably mounted individually so that each of the light emitting elements 105a to 105c functions independently.

(Light Emitting Element)

The light emitting elements 105a to 105c of the present invention comprises a semiconductor light emitting element and is capable of emitting at least visible light. For color scanner or the like, light emitting elements capable of emitting at least three primary colors of light (i.e., red, blue, and green) are preferably used. Specifically, for constructing blue and green light emitting elements, ZnSe and nitride semiconductor ($In_XAl_YGa_{1-X-Y}N$, $0 \leq X$, $0 \leq Y$, $X+Y \leq 1$) may be used. For constructing red light emitting elements, GaAs, InP, and the like may be used. Moreover, light emitting elements comprising materials other than that described above may be used. Also, light emitting elements capable of emitting light other than three primary colors of light may also be used. Composition, emitting color, size, and number of the light emitting elements can be selected arbitrarily according to purpose. These light emitting elements 105a to 105c are arranged in the first opening portion 100A. In the case where the light emitting elements 105a to 105c comprise a semiconductor layer grown on an insulating substrate, such as a light emitting element comprising a nitride semiconductor layer grown on a sapphire substrate, and the substrate side is the mounting surface, one or more of the light emitting elements 105a to 105c may be mounted either on the insulating member 104 at the bottom surface of the first opening portion 100A or on the conductive members 103a to 103d. Also, as described above and shown in FIG. 1D, the light emitting elements 105a to 105c may be mounted on the protruding portion 102A of the base substrate 102. With this configuration, heat generated from the light emitting elements 105a to 105c can be transferred very efficiently to the base substrate 102, so that excellent heat dissipation can be obtained. The conductive members 103a to 103d and the light emitting elements 105a to 105c can be electrically connected by connecting the electrode provided on the light emitting elements 105a to 105c and the conductive members 103a to 103d using a wire (such as the wire 107 shown in FIG. 1D) made of gold, and the like. In the case where not the insulating substrate side but the semiconductor layer side which is grown on the insulating substrate is the mounting surface, that is, when the electrode disposed on the semiconductor layer is bonded to a conductive member by using an adhering member, the light emitting elements 105a to 105c may be mounted on the corresponding conductive members 103a to 103d.

In the case where the light emitting elements 105a to 105c is a semiconductor layer grown on a conductive substrate, for example, a light emitting element made of a nitride semiconductor layer grown on a SiC substrate or a light emitting element made of a GaAs semiconductor layer grown on a GaAs substrate, electrical connection is needed to be established through the back surface of the light emitting elements 105a to 105c. Therefore, the light emitting elements 105a to 105c are preferably mounted on the corresponding conductive members 103a to 103d which are exposed at the bottom surface of the first opening portion 100A. In this case, an adhering member of conductive material is used.

The mounting position of each color of the light emitting elements 105a to 105c is not specifically limited and arbitrarily selected in view of the mounting position of the conductive members 103a to 103d and optical characteristics or the like. The light emitting elements 105a to 105c can also be mounted at the bottom surface of the first opening portion 100A via a submount etc.

(Third Opening Portion)

Figure 2B:
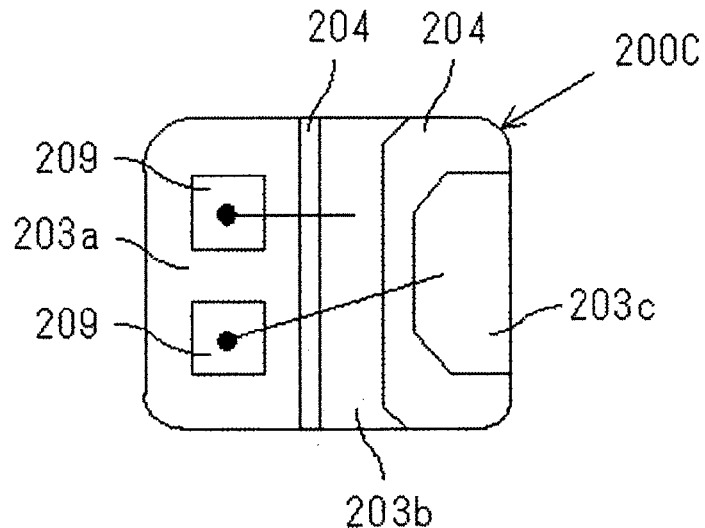
FIG. 2B is a partially enlarged view of the light emitting device illustrated in FIG. 2A.
Figure 3:
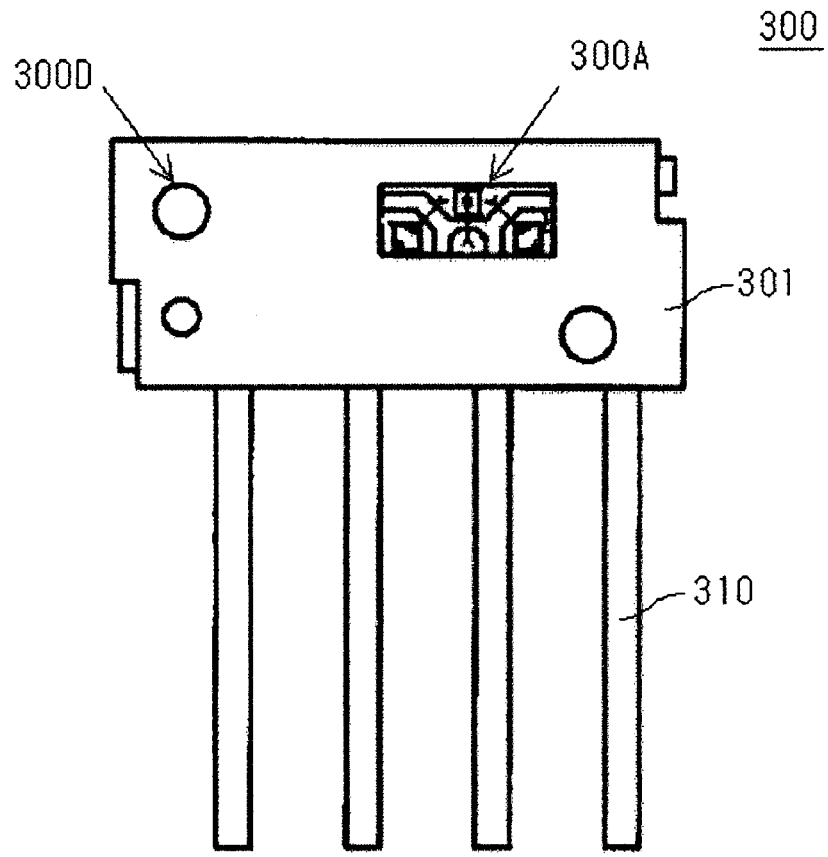
FIG. 3 is a front elevational view showing a conventional light emitting device.

In addition to a semiconductor light emitting element (e.g., the light emitting elements 105a to 105c), a semiconductor photodetector, and further, a protective element (e.g. a Zener diode and a condenser) that protects such semiconductor elements from damage caused by overvoltage, or combination of two or more thereof may be mounted in the light emitting device. In this case, it is preferable to provide a third opening portion separately from the first and second opening portions so as to mount the additional element therein. For example, as shown in FIGS. 2A and 2B, a third opening portion 200C is provided at a position spaced from the first opening portion 200A. The protective elements 209 are mounted in the third opening portion 200C and electrically connected by using wires or the like, then, covered with a sealing member and the like. The conductive member exposed at the third opening portion 200C is continuously provided so that the conductive member is also exposed at the first and second opening portions 200A and 200B. For the sealing member herein, a similar member (e.g., the sealing member 106 illustrated in FIG. 1D) as described above applied to the first opening portion 100A can be used. Further, the sealing member in the third opening portion 200C does not have to be light transmissive, so that an opaque member can be used.

The light emitting device shown in FIG. 2A comprises a plurality of through holes 200D in addition to the first to third opening portions 200A to 200C. The through holes 200D pass through from the upper surface of the package member 201 to the rear surface of the base substrate, and thus, position adjustment can be easily realized. Single or multiple through holes can be provided in a region where the electric conduction is not affected. For example, as shown in FIG. 2A, the through holes 200D may be provided at four positions. Size and shape of the through holes 200D can also be arbitrarily selected, for instance, as shown in FIG. 2A, two sets of columnar through holes 200D with different diameters are provided. Such through holes 200D are more effective as the size of the light emitting device increases. Especially, when the light emitting device is used in application likely associated with vibration or shock, adversely affect on optical characteristics can be avoided while maintaining electric conductivity.

(Lighting Device)

In the lighting device of the present invention, a light emitting device is arranged at an end surface of a light guide (such as the light guide 412 illustrated in FIG. 4) having a bar shape or a plate shape and, for example, the lighting device may be designed as such device used for a line lighting in a scanner or other information processor. Specifically, a light guide is housed in a light guide case (such as the light guide case 411 illustrated in FIG. 4) so as to expose the emission surface, and the light emitting device (e.g., the light emitting device 100 or 200) is arranged at an end surface of the light guide case so as to introduce incident light. Especially, in the present invention, the first opening portion (e.g., the first opening portion 100A or 200A) in which the light emitting element is arranged and the end surface of the light guide are arranged in face-to-face relation. Examples of the material for the light guide include light transmitting members such as glass and acrylic resin. In order to make uniform line light source, a light scattering pattern may be formed on the surface of the light guide by applying embossing treatment or light-scattering material or the like.

In addition to the light guide for transmitting light, the external electrodes are provided in the lighting device. The conducting portions of the external electrodes and the conductive members (e.g., the conducting members 103a to 103d) exposed at the bottom surface of the second opening portions (e.g., the second opening portions 100B or 200B) of the light emitting device are electrically connected. The connection between the external electrodes and the conductive members can be established by using a conductive wire etc. which is bonded with a bonding material such as a solder, or an electric bonding may be established by using an external electrode having a shape which fits with the second opening portions without using a bonding material. For example, the external electrodes are formed with shapes that fit to the second opening portions of the light emitting device, and a conductive portion may be provided on the surface of the external electrode corresponding to the conductive member of the second opening portion. With this arrangement, positioning can be achieved only by fitting them together and the electrical connection can also be established. With the construction described above, the light emitting device can be detached easily.

INDUSTRIAL APPLICABILITY

The light emitting device of the present invention can be utilized not only for lighting device used in an image reading apparatus such as a facsimile, copier machine, image scanner, but also for an indoor lighting apparatus, industrial lighting apparatus or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

This application is based on Japanese Patent Application No. 2006-128144 filed in Japan on May 2, 2006, the contents of which are incorporated hereinto by reference.

What is claimed is:

1. A light emitting device comprising:
   a planar base substrate made of a metal;
   an insulating member disposed on a main surface of the planar base substrate;
   a conductive member disposed on the insulating member; and
   a package member bonded to the insulating member and the conductive member with the insulating member and the conductive member being disposed at least partially between the base substrate and the package member,
   the package member has a plurality of opening portions where the insulating member and the conductive member are exposed at bottom parts thereof, the opening portions including
      a first opening portion in which a light emitting element is mounted, and
      a second opening portion located separate from the first opening portion and also opens to a side surface of the package member with the conductive member being exposed to outside so that an electric connection to the light emitting element is established when an external electrode is connected to the conductive member in the second opening portion.

2. The light emitting device according to claim 1, wherein a portion of the base substrate penetrates the insulating member such that the portion of the base substrate is exposed at the bottom part of one of the first and second opening portions.

3. The light emitting device according to claim 1, wherein the package member has a third opening portion in which a protective element is mounted.

4. The light emitting device according to claim 2, wherein the package member has a third opening portion in which a protective element is mounted.

5. A lighting device comprising:
   a light emitting device including
      a planar base substrate made of a metal,
      a package member bonded to a main surface side of the base substrate, and
      an insulating member and a conductive member disposed at least partially between the base substrate and the package member,
      the package member having a plurality of opening portions where the insulating member and the conductive member are exposed at bottom parts thereof, the opening portions including a first opening portion in which a light emitting element is mounted and a second opening portion located separate from the first opening portion and also opens to a side surface of the package member;
   a light guide having an end surface coupled to the light emitting device such that light emitted from the light emitting element in the first opening portion is introduced to the light guide from the end surface; and
   an external electrode connected with the conductive member exposed at the bottom part of the second opening portion.

6. A lighting device comprising:
a light emitting device including
- a planar base substrate made of a metal,
- a package member bonded to a main surface side of the base substrate, and
- an insulating member and a conductive member disposed at least partially between the base substrate and the package member,
- the package member having a plurality of opening portions where the insulating member and the conductive member are exposed at bottom parts thereof, the opening portions including a first opening portion in which a light emitting element is mounted and a second opening portion located separate from the first opening portion and also opens to a side surface of the package member,
- wherein a portion of the base substrate penetrates the insulating member such that the portion of the base substrate is exposed at the bottom part of one of the first and second opening portions;

a light guide having an end surface coupled to the light emitting device such that light emitted from the light emitting element in the first opening portion is introduced to the light guide from the end surface; and an external electrode connected with the conductive member exposed at the bottom part of the second opening portion.

7. The lighting device recited in claim 5, wherein
the packaging member of the light emitting device further includes a third opening portion in which a protective element is mounted.

8. A lighting device comprising:
a light emitting device including
- a planar base substrate made of a metal,
- a package member bonded to a main surface side of the base substrate, and
- an insulating member and a conductive member disposed at least partially between the base substrate and the package member,
- the package member having a plurality of opening portions where the insulating member and the conductive member are exposed at bottom parts thereof, the opening portions including a first opening portion in which a light emitting element is mounted and a second opening portion located separate from the first opening portion and also opens to a side surface of the package member,
- wherein a portion of the base substrate penetrates the insulating member such that the portion of the base substrate is exposed at the bottom part of one of the first and second opening portions, and
- wherein the package member has a third opening portion in which a protective element is mounted;

a light guide having an end surface coupled to the light emitting device such that light emitted from the light emitting element in the first opening portion is introduced to the light guide from the end surface; and an external electrode connected with the conductive member exposed at the bottom part of the second opening portion.

9. The light emitting device according to claim 1, wherein
the base substrate includes a protruding portion disposed in the first opening portion of the package member so that the light emitting element is mounted on the protruding portion.

10. The light emitting device according to claim 1, wherein
the base substrate and the package member form a through hole that penetrates through the base substrate and the package member.

\* \* \* \* \*